United States Patent
Zaal et al.

(10) Patent No.: US 10,315,821 B2
(45) Date of Patent: Jun. 11, 2019

(54) COMPONENT CARRIER

(71) Applicant: NXP B.V., Eindhoven (NL)

(72) Inventors: Jeroen Johannes Maria Zaal, Nijmegen (NL); Roelf Anco Jacob Groenhuis, Nijmegen (NL); Leo van Gemert, Nijmegen (NL); Caroline Catharina Maria Beelen-Hendrikx, Nijmegen (NL)

(73) Assignee: NXP B.V., Eindhoven (NL)

( * ) Notice: Subject to any disclaimer, the term of this patent is extended or adjusted under 35 U.S.C. 154(b) by 361 days.

(21) Appl. No.: 15/352,214

(22) Filed: Nov. 15, 2016

(65) Prior Publication Data

US 2018/0134473 A1    May 17, 2018

(51) Int. Cl.
| | | |
|---|---|---|
| *B65D 73/02* | (2006.01) | |
| *H01L 21/683* | (2006.01) | |
| *H01L 23/06* | (2006.01) | |
| *H01L 23/053* | (2006.01) | |

(52) U.S. Cl.
CPC .......... *B65D 73/02* (2013.01); *H01L 21/6835* (2013.01); *H01L 21/6836* (2013.01); *H01L 23/053* (2013.01); *H01L 23/06* (2013.01); *H01L 2221/68309* (2013.01); *H01L 2221/68313* (2013.01)

(58) Field of Classification Search
CPC ..... B65D 73/02; H01L 21/6863; H01L 23/06; H01L 23/053; H01L 21/6835; H01L 2221/68309; H01L 2221/68313
See application file for complete search history.

(56) References Cited

U.S. PATENT DOCUMENTS

| | | |
|---|---|---|
| 4,657,137 A | 4/1987 | Johnson |
| 4,966,282 A | 10/1990 | Kawanishi et al. |
| 5,103,976 A | 4/1992 | Murphy |
| 6,505,741 B1 | 1/2003 | Ono |
| 6,681,937 B2 | 1/2004 | Yamoto et al. |
| 2001/0027933 A1 | 10/2001 | Sasamura et al. |
| 2005/0073037 A1 | 4/2005 | Wright et al. |

FOREIGN PATENT DOCUMENTS

EP    0570128 A1    11/1993

*Primary Examiner* — Michael C Miggins

(57) ABSTRACT

One example discloses a component carrier, including: a cavity; wherein the cavity includes a set of cavity registration features configured to engage with a set of component registration features on a component; and wherein the cavity registration features are within the cavity.

18 Claims, 9 Drawing Sheets

COMPONENT CARRIER

The present specification relates to systems, methods, apparatuses, devices, articles of manufacture and instructions for a component carrier.

SUMMARY

According to an example embodiment, a component carrier, comprising: a cavity; wherein the cavity includes a set of cavity registration features configured to engage with a set of component registration features on a component; and wherein the cavity registration features are within the cavity.

In another example embodiment, the cavity includes a floor region; and the set of cavity registration features are included in the floor region.

In another example embodiment, . . . .
wherein the set of cavity registration features are configured to position, orient or align a component within the cavity.

In another example embodiment, the set of cavity registration features have at least one of: a regular pitch, a variable pitch, or an aperiodic pitch.

In another example embodiment, the set of cavity registration features each have a same geometric shape.

In another example embodiment, the set of cavity registration features include a set of different geometric shapes.

In another example embodiment, the set of cavity registration features include at least one of: a topography, a protrusion, a hemisphere, a rectangle, a ridge, a circle, a polygon, a pillar, an arc, an egg-tray, or an interlocking feature.

In another example embodiment, the cavity is a continuous cavity configured to engage with the component registration features of more than one component.

In another example embodiment, the cavity is configured to variably separate the more than one component.

In another example embodiment, the cavity is one of a set of separate or individual cavities configured to engage with the component registration features of more than one component.

In another example embodiment, the set of separate cavities are separated by a set of barriers.

In another example embodiment, the set of separate or individual cavities are configured to regularly separate the more than one component.

In another example embodiment, the set of cavity registration features are thermally formed or embossed onto the carrier substrate.

In another example embodiment, the carrier substrate is at least one of: plastic, polyvinyl chloride, laminate, paper or metal.

In another example embodiment, the component carrier is configured to carry at least one of: an Integrated Circuit (IC) package, a chip, a die, a passive electronic component, an active electronic component, a microcontroller, a microprocessor, a module, a MEMS device, or a MOEMS device, a non-electronic device, or a micro-fluidic device.

In another example embodiment, the component carrier is wound on a reel configured to be used with a pick-and-place machine or an automatic component placement machine.

In another example embodiment, the component carrier is configured as a shipping container.

According to an example embodiment, a method of manufacturing a component carrier, comprising: forming a cavity in the component carrier; and forming a set of cavity registration features within the cavity; wherein the cavity registration features are configured to engage with a set of component registration features on a component.

In another example embodiment, further comprising: forming a floor region in the cavity; and forming the set of cavity registration features in the floor region.

According to an example embodiment, a chip packaging tape, comprising: a recess; wherein the recess includes a set of recess registration features configured to engage with a set of component registration features on a component; and wherein the recess registration features are within the recess.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

Figure 1:
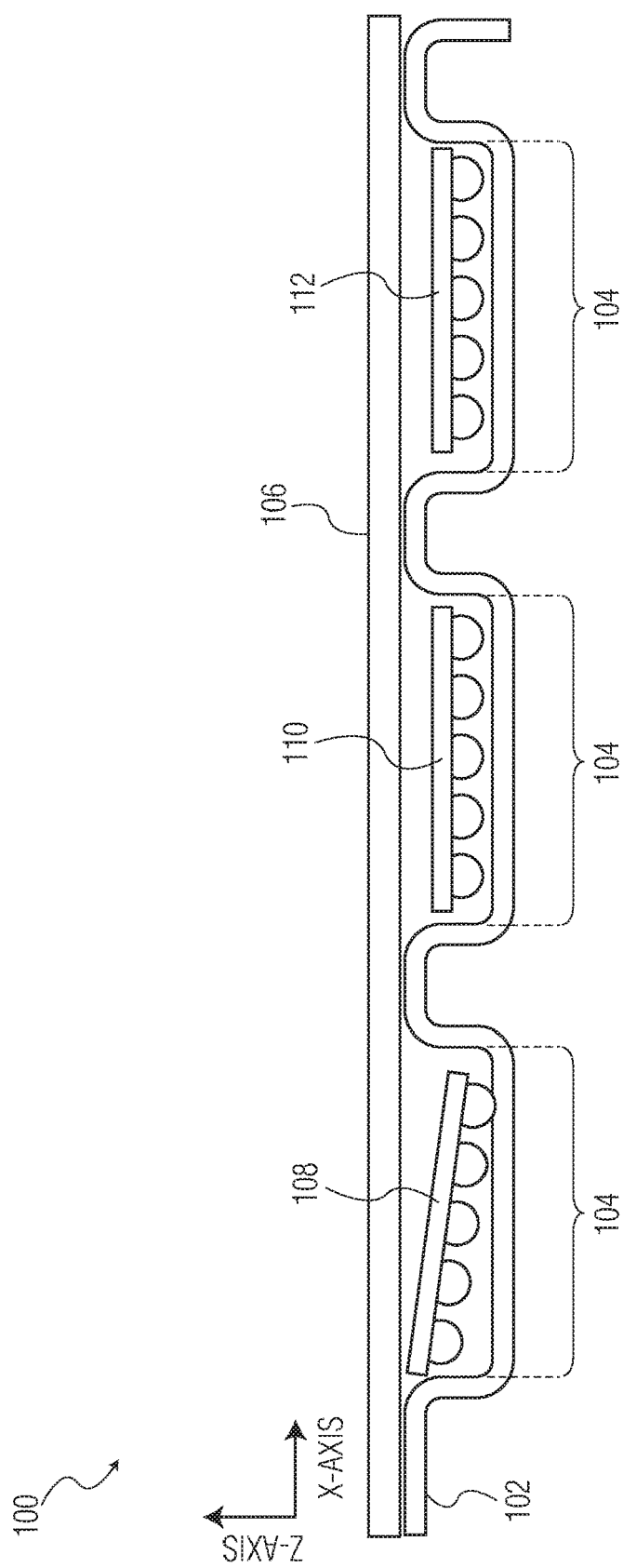
FIG. 1 is a first example of a component carrier.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

FIG. 1 is a first example 100 of a component carrier. The first component carrier 100 includes a carrier tape 102, a set of cavities 104 (e.g. recesses, pockets, etc.), and a cover layer 106 (e.g. cover tape). Within one of the cavities 104 is a first component 108, within another cavity 104 is a second component 110, and within yet another cavity 104 is a third component 112.

The carrier 100 can be used as a packaging material for transporting electronic or non-electronic components such as integrated circuits, chips, microfluidic devices, etc. to a customer, and then used in the customer's pick and place machines for later circuit board assembly.

The cavities 104 in some examples are formed with dimensions appropriate for a single sized component to be placed inside each cavity 104.

Each component may be a little different so a different carrier 100 may be used for each component size. However, such components (for example thin wafer level chip scale packages) may still move in their carrier tape's 102 cavities 104 due to tolerances in the carrier tape 102 fabrication process and due to tool limitations. FIG. 1 shows an example of such misalignment where the first component 108 is misaligned within its cavity 104.

Some component specific carriers 100 are by design, limited to components of a single size. This prevents a particular carrier tape 102 from being used to stabilize products/packages of different sizes, lest such products/packages move within the cavity.

Figure 2:
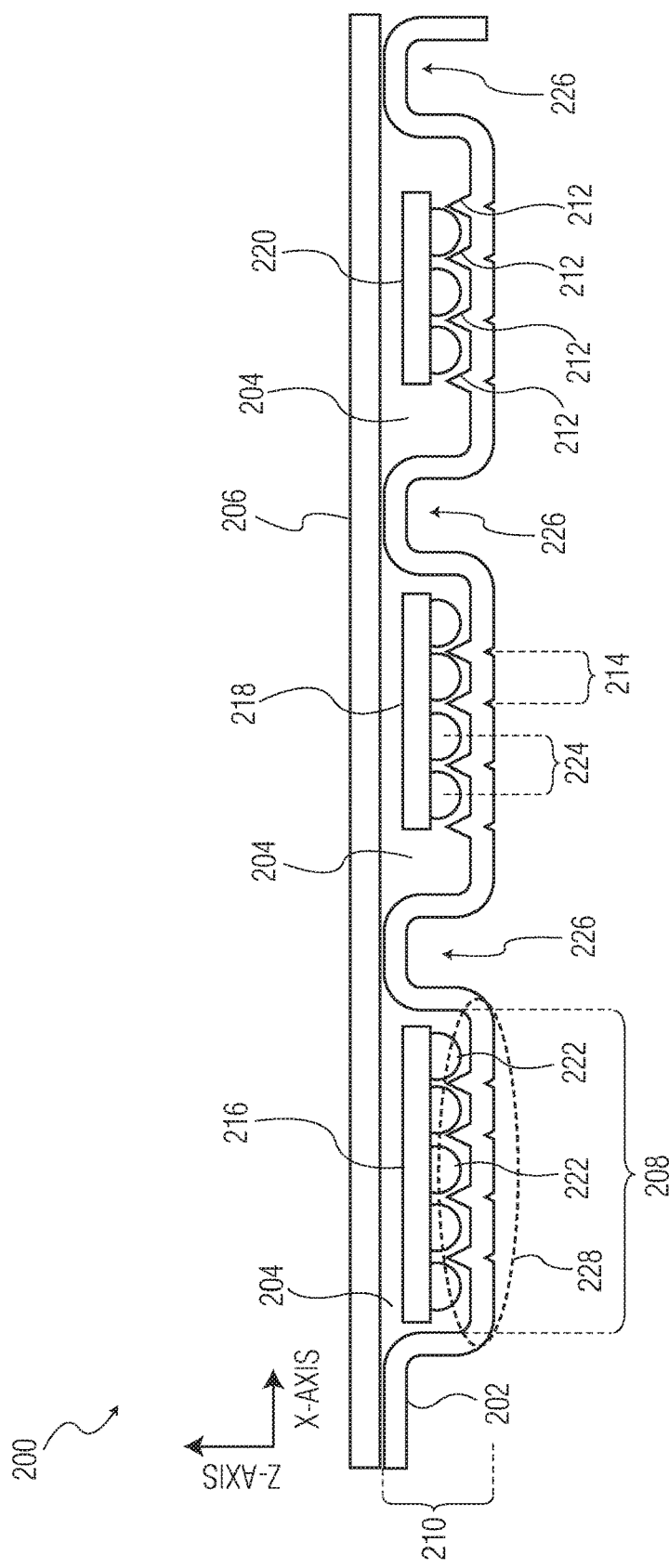
FIG. 2 is a second example of a component carrier.

FIG. 2 is a second example 200 of a component carrier (e.g. a product shipping container). The second component carrier 200 includes, a carrier substrate 202, a set of cavities 204 (e.g. set of separate/individual recesses/pockets for components), and a cover layer 206.

The component carrier 200 can be configured to carry at least one of: an Integrated Circuit (IC) package, a chip, a die, a passive electronic component, an active electronic component, a microcontroller, a microprocessor, a module, a MEMS device, or a MOEMS device. Note that in an alternate example embodiment, the carrier 200 can also carry non-electronic devices such as a microfluidic device, as well as other mechanical structures.

Each cavity 204 has a length 208 (x-axis), a height 210 (z-axis), a width (not shown) (y-axis), and a set of cavity registration features 212 (e.g. interlocking structures, notches, etc.). The cavity registration features 212 are separated from each other by a cavity registration feature pitch 214. "Pitch" is a distance between centers of at least two structure, such as a distance between each of the cavity registration features 212 or a distance between centers of two solder balls on a chip package.

In this example embodiment, each cavity 204 is separated by a set of x-axis barriers 226. Not shown are a set of y-axis barriers. The set of x-axis barriers 226 thus form a set of separate or individual cavities configured to engage with various component registration features on more than one component.

For illustration purposes, FIG. 2 shows that within one of the cavities 204 is a first component 216, having a set of first component registration features 222 (e.g. five x-axis solder bumps). The first component registration features 222 are separated from each other by a component registration feature pitch 224 (e.g. solder bump pitch).

Within another cavity 204 is a second component 218, having a set of second component registration features (e.g. four x-axis solder bumps).

Within yet another cavity 204 is a third component 220, having a set of third component registration features (e.g. three x-axis solder bumps).

The cavity registration features 212 within a floor region 228 of the cavities 204 are configured to engage with the set of component registration features 222 on the components 216, 218, 220. Thus the set of cavity registration features 212 are configured to position, orient or align components of varying size and shape within the cavities 204.

In one example embodiment, the cavity registration features 212 (e.g. small protrusions on the cavity 204 bottom) accommodate WLCSP balls much like an egg tray. This improves the capability of the carrier substrate 202 (e.g. carrier tape) to hold the WLCSP in a desired location.

In some example embodiments, the height 210 (z-axis) (e.g. depth) of the cavities 204 need to be at least as tall as the component's 216, 218, 220 height, but not "too tall" so as to permit the component's 216, 218, 220 to "bounce around" in the carrier 200.

In various example embodiments, the set of cavity registration features 212 may have a regular or variable pitch and/or a same or different geometric shape.

The set of cavity registration features 212 can include at least one of: a topography, a protrusion, a hemisphere, a rectangle, a ridge, a circle, a polygon, a pillar, an arc, an egg-tray, or an interlocking feature.

The set of cavity registration features 212 can be thermally formed or embossed onto the carrier substrate 202.

The carrier substrate 202 can be made from at least one of: plastic, polyvinyl chloride, laminate, paper or metal.

In one example embodiment, the component carrier 200 is wound on a reel and configured to be used with a pick-and-place machine or an automatic component placement machine.

The component carrier 200 can be manufactured at least by: forming a cavity, having a floor region, in the component carrier; and forming a set of cavity registration features on the floor region within the cavity; wherein the cavity registration features are configured to engage with a set of component registration features on a component.

The carrier 200 discussed above limits movement of a packaged product and makes various example embodiments of the carrier 200 suitable for multiple package/array sizes.

Figure 3A:
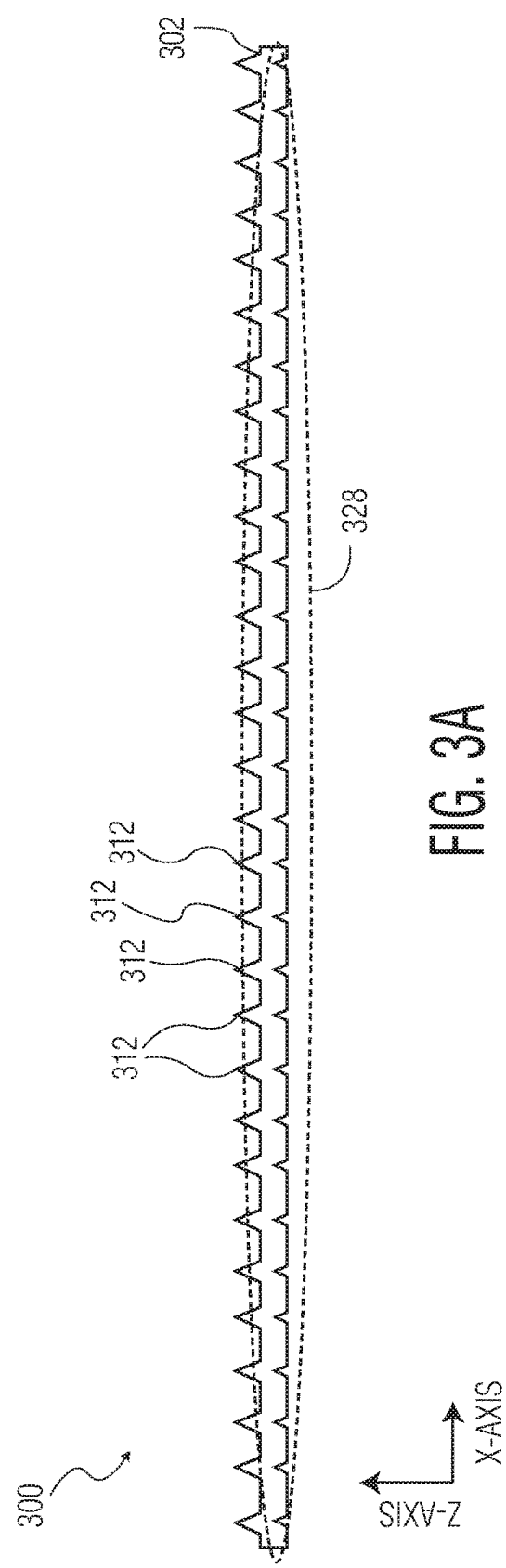
FIGS. 3A, 3B, 3C are a third example of a component carrier.
Figure 3B:
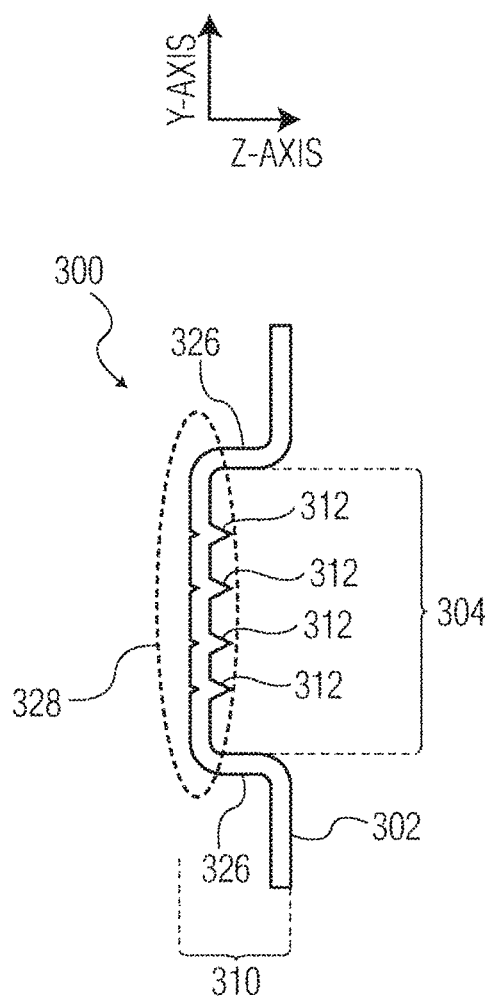
Figure 3C:
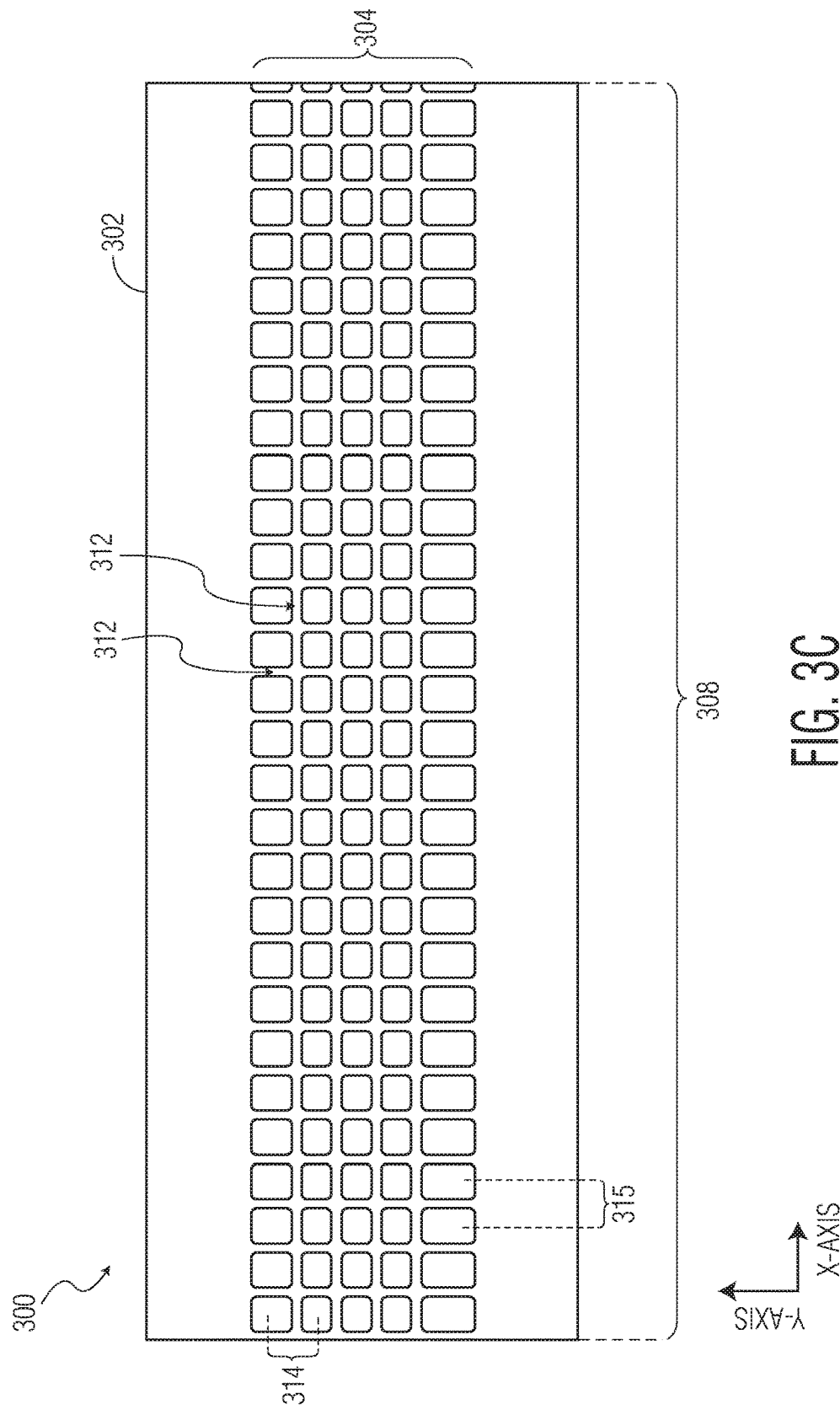

FIGS. 3A, 3B, 3C are a third example 300 of a component carrier. The third component carrier 300 includes, a carrier substrate 302, and a single continuous cavity 304.

FIG. 3A is a cross section of the component carrier 300 in the x-z plane; FIG. 3B is a cross section of the component carrier 300 in the y-z plane; and FIG. 3C—a top-view of the component carrier 300 in the x-y plane.

Each cavity 304 has a length 308 (x-axis), a height 310 (z-axis), a width (same as 304) (y-axis), and a set of cavity registration features 312. The cavity registration features 312 are separated from each other by a first cavity registration feature pitch 314 (y-axis) and a second cavity registration feature pitch 315 (x-axis). The first pitch 314 and second pitch 315 can be the same or different, depending upon the components to be carried.

The single continuous cavity 304 is further defined by a set of y-axis barriers 326 (e.g. sidewalls) and a floor region 328. The continuous cavity's 304 registration features 312 are configured to engage with a component's registration features. Since there are no barriers along the x-axis of the continuous cavity 304, components can be of different sizes and/or regularly or variably separated within the carrier 300. In one example embodiment, sets of different electronic and/or mechanical components, perhaps with the same pitch, are capable of being placed in a same cavity 304 (e.g. reel). In such an example, a complete set of electronic and mechanical components, perhaps suitable for a certain application already pre-grouped in the cavity 304.

FIGS. 3A, 3B and 3C show an example embodiment where the individual cavities 204 of FIG. 2 are replaced by the continuous cavity 304. The continuous cavity 304 permits components of same or varying size to be spaced a regular or irregular intervals, thereby permitting flexibility of component size, carrying and/or placement in the carrier 300.

Figure 4A:
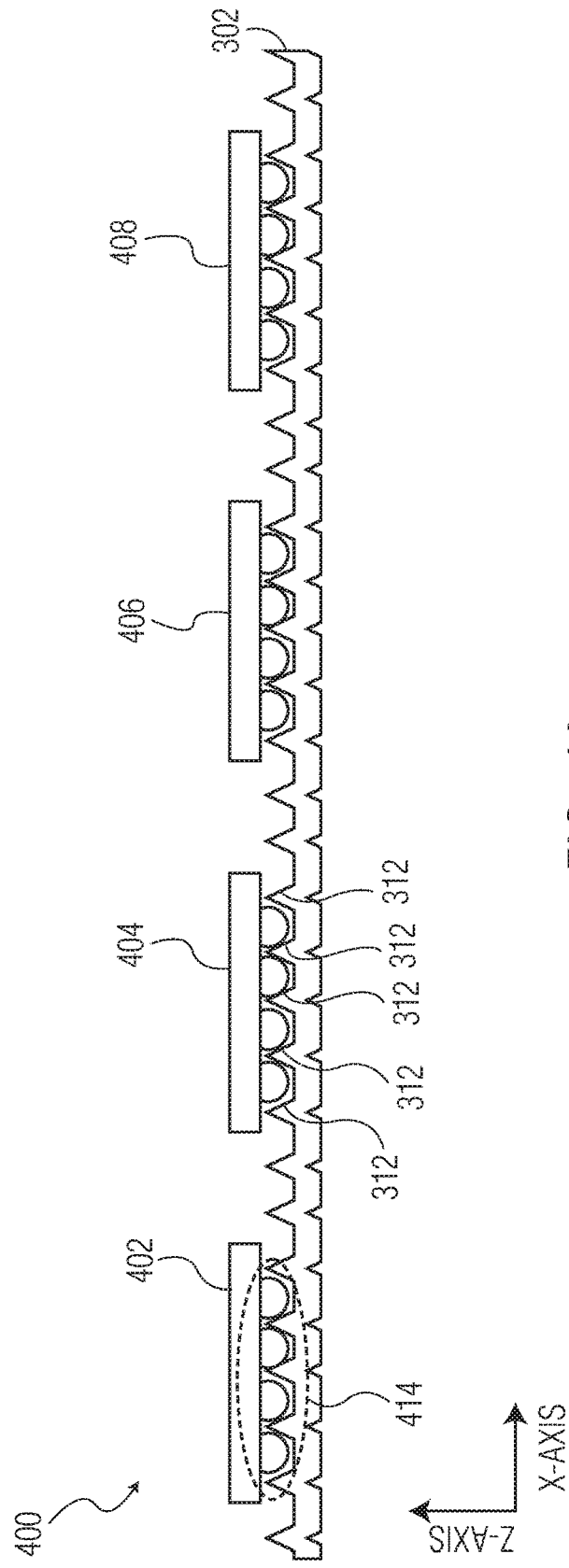
FIGS. 4A, 4B, 4C are an example of the third example of a component carrier paired with a set of components.
Figure 4B:
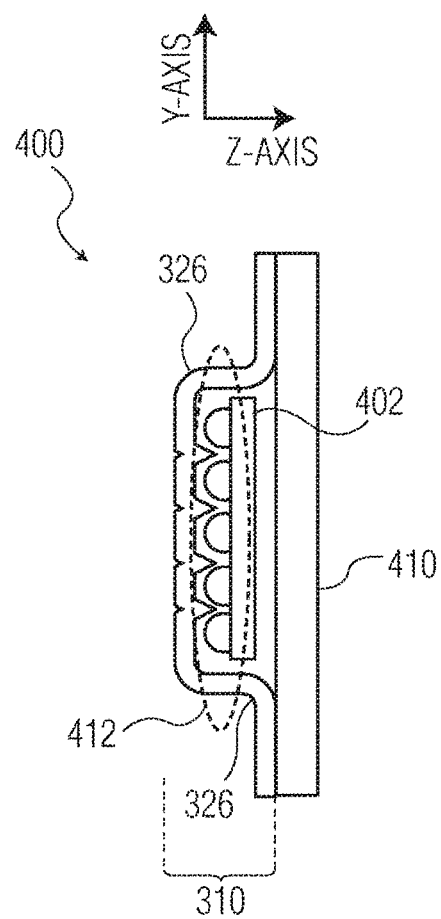
Figure 4C:
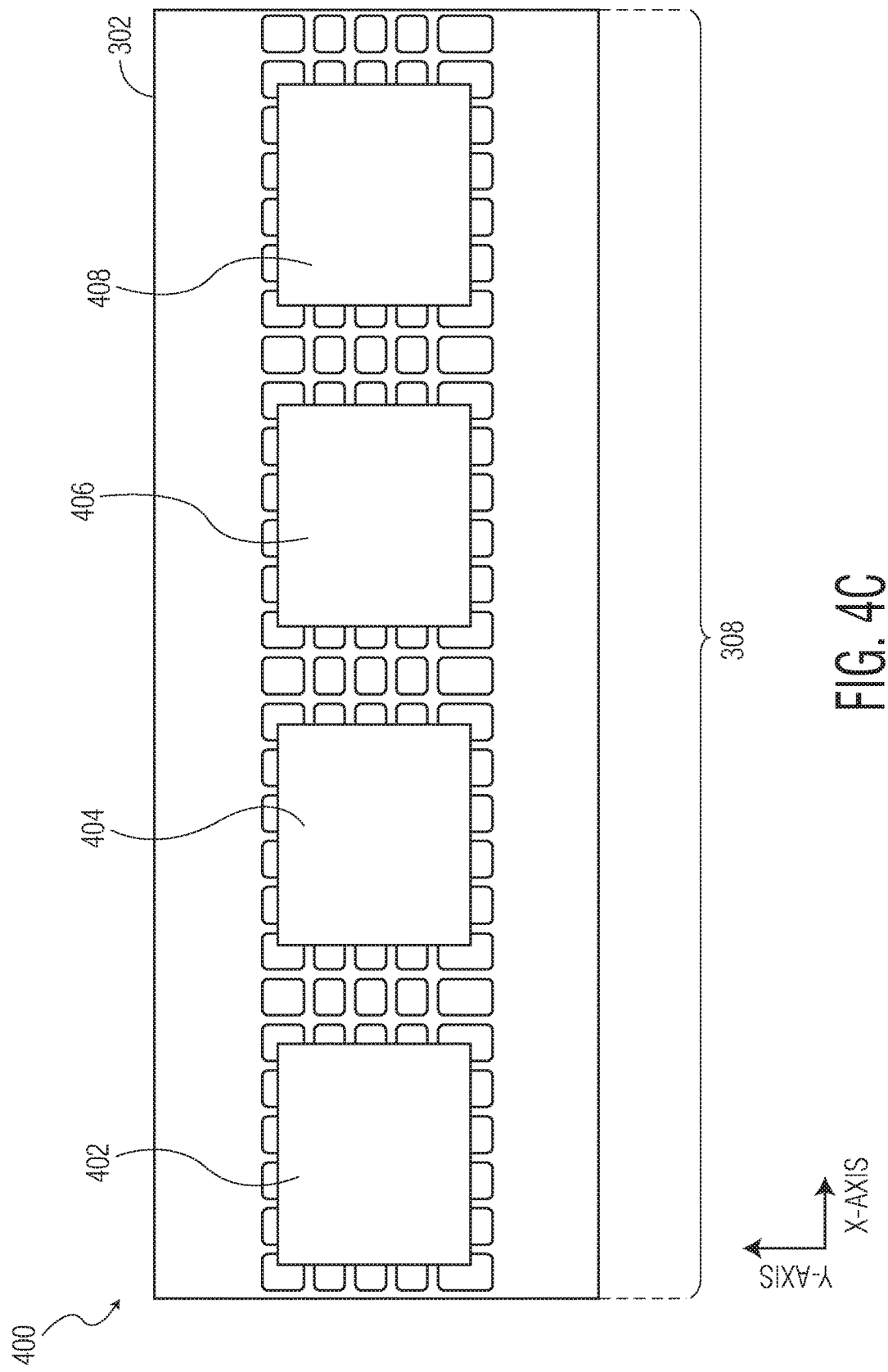

FIGS. 4A, 4B, 4C are an example 400 of the third example 300 of a component carrier paired with a set of components.

FIG. 4A is a cross section of the component carrier 300 in the x-z plane filled with a set of components 402, 404, 406, 408; FIG. 4B is a cross section of the component carrier 300 in the y-z plane showing an edge of one of the components; and FIG. 4C—a top-view of the component carrier 300 in the x-y plane showing the set of components. In one example, the components 402, 404, 406, 408 within the carrier 300 are overlaid by a cover layer 410.

In this example embodiment, FIG. 4B shows that within the single continuous cavity 304 the components 402, 404, 406, 408 include a first set of component registration features 412 (e.g. five y-axis solder bumps) that the set of cavity registration features 312 cause the components 402, 404, 406, 408 to be aligned along the y-axis.

Similarly, FIG. 4A shows that within the single continuous cavity 304 the components 402, 404, 406, 408 include a second set of component registration features 414 (e.g. four x-axis solder bumps) that the set of cavity registration features 312 cause the components 402, 404, 406, 408 to be aligned along the x-axis.

The continuous cavity 304 in some example embodiments, permits lower carrier 300 costs due to a reduction in a number of carriers 300 required to carry components of varying sizes and shapes.

The cavity registration features 312 encourages less movement of a product in the carrier 300 and tends to reduce issues with chips or other products sticking in a barrier corner between a cover layer and a carrier substrate, thereby reducing damage to products and reducing customer concerns.

Figure 5A:
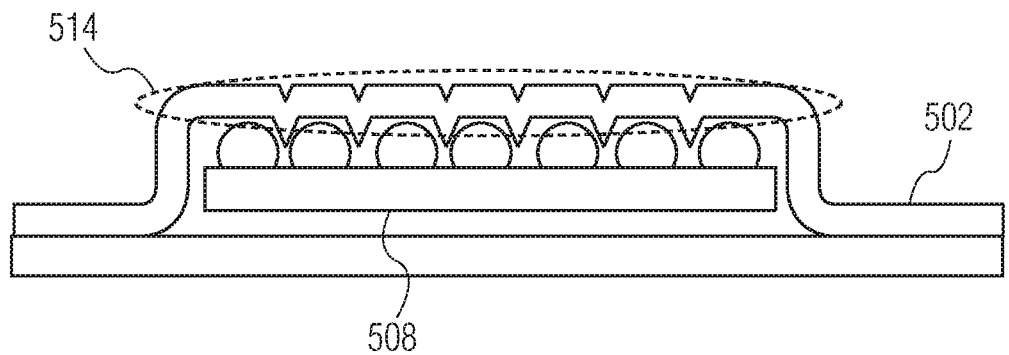
FIGS. 5A, 5B, 5C are examples of additional component carriers, paired with various components.
Figure 5B:
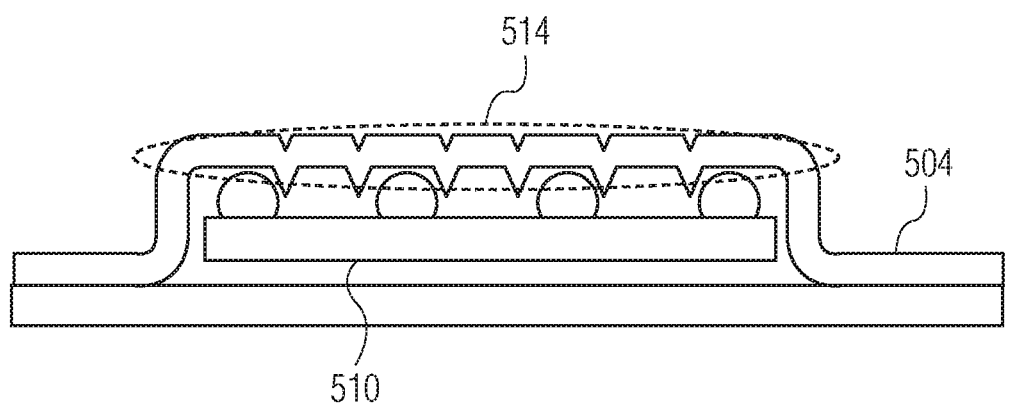
Figure 5C:
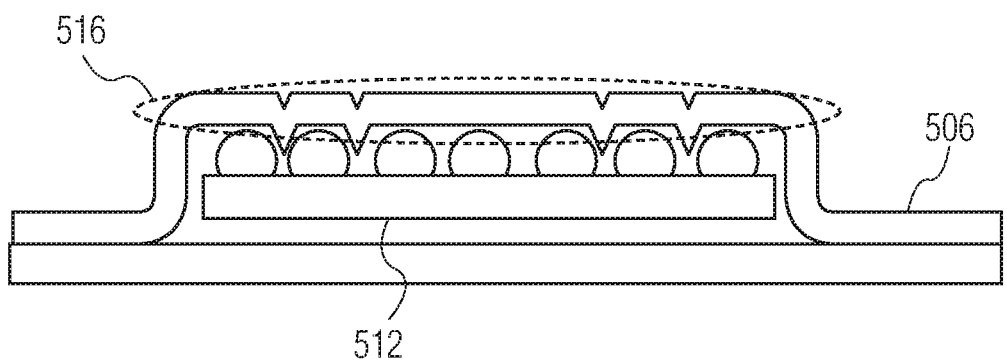

FIGS. 5A, 5B, 5C are examples of additional component carriers 502, 504, 506 paired with various components 508, 510, 512. Component carriers 502, 504 have a first set of cavity registration features 514. Component carrier 506 has a second set of cavity registration features 516.

Comparing the first and second component carriers 502, 504, the second component carrier 504 includes the component 510 which has a depopulated bump layout (i.e. bumps are skipped). Note, dies can also be packaged using the same carrier layout.

In other examples, components can have more bumps in one cavity, for various reasons like: some bumps have a different pitch from other bumps; component alignment in the carrier is done using one pitch on the component and/or in the registration features; other bumps are accommodated by leaving out some registration features (see second set of cavity registration features 516 in FIG. 5C having an aperiodic layout) if necessary; not all registration features may be needed; and/or different component bump types and/or dimensions are included on a single component.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A component carrier, comprising:
    a cavity;
    wherein the cavity includes a set of cavity registration features configured to engage with a set of component registration features on a component; and
    wherein the cavity registration features are within the cavity and the cavity is a continuous cavity configured to engage with the component registration features of more than one component.
2. The carrier of claim 1:
    wherein the cavity includes a floor region; and
    wherein the set of cavity registration features are included in the floor region.
3. The carrier of claim 1:
    wherein the set of cavity registration features are configured to position, orient or align a component within the cavity.
4. The carrier of claim 1:
    wherein the set of cavity registration features have at least one of: a variable pitch, or an aperiodic pitch.
5. The carrier of claim 1:
    wherein the set of cavity registration features each have a same geometric shape.
6. The carrier of claim 1:
    wherein the set of cavity registration features include a set of different geometric shapes.
7. The carrier of claim 1:
    wherein the set of cavity registration features include at least one of: a topography, a protrusion, a hemisphere, a rectangle, a ridge, a circle, a polygon, a pillar, an arc, an egg-tray, or an interlocking feature.
8. The carrier of claim 1:
    wherein the cavity is one of a set of separate or individual cavities configured to engage with the component registration features of more than one component.
9. The carrier of claim 1:
    wherein the set of cavity registration features are thermally formed or embossed onto the carrier substrate.
10. The carrier of claim 1:
    wherein the carrier substrate is at least one of: plastic, polyvinyl chloride, laminate, paper or metal.
11. The carrier of claim 1:
    wherein the component carrier is configured to carry at least one of: an Integrated Circuit (IC) package, a chip, a die, a passive electronic component, an active electronic component, a microcontroller, a microprocessor, a module, a MEMS device, or a MOEMS device, a non-electronic device, or a micro-fluidic device.
12. The carrier of claim 1:
    wherein the component carrier is wound on a reel configured to be used with a pick-and-place machine or an automatic component placement machine.
13. The carrier of claim 1:
    wherein the component carrier is configured as a shipping container.
14. The carrier of claim 1:
    wherein the cavity is configured to variably separate the more than one component.
15. The carrier of claim 14:
    wherein the set of separate cavities are separated by a set of barriers.
16. The carrier of claim 14:
    wherein the set of separate or individual cavities are configured to regularly separate the more than one component.
17. A method of manufacturing a component carrier, comprising:
    forming a cavity in the component carrier; and
    forming a set of cavity registration features within the cavity;
    wherein the cavity registration features are configured to engage with a set of component registration features on a component and the cavity is a continuous cavity configured to engage with the component registration features of more than one component.
18. The method of claim 17, further comprising:
    forming a floor region in the cavity; and
    forming the set of cavity registration features in the floor region.

* * * * *